US008064832B2

(12) United States Patent
Suryagandh et al.

(10) Patent No.: US 8,064,832 B2
(45) Date of Patent: Nov. 22, 2011

(54) METHOD AND TEST SYSTEM FOR DETERMINING GATE-TO-BODY CURRENT IN A FLOATING BODY FET

(75) Inventors: Sushant S. Suryagandh, Sunnyvale, CA (US); Ciby Thomas Thuruthiyil, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 845 days.

(21) Appl. No.: 11/879,939

(22) Filed: Jul. 18, 2007

(65) Prior Publication Data
US 2009/0021280 A1   Jan. 22, 2009

(51) Int. Cl.
*H04B 7/00* (2006.01)
(52) U.S. Cl. .................. 455/41.3; 324/769; 257/48
(58) Field of Classification Search .............. 455/41.3; 324/769; 257/48; 703/2, 14
See application file for complete search history.

(56) References Cited

U.S. PATENT DOCUMENTS

| | | | | |
|---|---|---|---|---|
| 5,687,355 | A * | 11/1997 | Joardar et al. | 716/20 |
| 7,011,980 | B1 * | 3/2006 | Na et al. | 438/17 |
| 2003/0173588 | A1 * | 9/2003 | Bianchi | 257/200 |

OTHER PUBLICATIONS

Das, Koushik K., and Brown, Richard B., "Novel Circuit Styles for Minimization of Floating Body Effects in Scaled PD-SOI CMOS", VLSI, 2003, Proceedings of the IEEE Computer Society Annual Symposium on VLSI (ISVLSI'03), pp. 29-34.*
Maddah, M., Bolouki, S., Afzali-Kusha, A., Mahmoud El-Nokali, "A Compact Modeling of Drain Current in PD/FD SOI MOSFETs", Microelectronics, The 14th International Conference on 2002—ICM, 2002, pp. 75-78.*
Wu, Weimin, et al., "A compact Model for Valence-Band Electron Tunneling Current in Partially Depleted SOI MOSFETs", IEEE Transactions on Electron Devices, vol. 54, No. 2, Feb. 2007, pp. 316-322.*
Lu, Pong-Fei et al., "Floating-Body Effects in Partially Depleted SOI CMOS circuits" IEEE Journal o f Solid State Circuits, vol. 32, No. 8, Aug. 1997, pp. 1241-1253.*

* cited by examiner

*Primary Examiner* — Nguyen Vo
*Assistant Examiner* — Ganiyu Hanidu
(74) *Attorney, Agent, or Firm* — Farjami & Farjami LLP

(57) ABSTRACT

In one disclosed embodiment, the present method for determining a gate-to-body current for a floating body FET comprises measuring at least three unique gate-to-body currents corresponding to at least three unique body-tied FET structures, determining at least three unique relationships between the at least three unique gate-to-body currents and at least three gate-to-body current density components for the at least three unique body-tied FET structures, and utilizing those at least three unique relationships to determine the at least three gate-to-body current density components; wherein one of the gate-to-body current density components is used to determine the gate-to-body current for the floating body FET. In one embodiment, a test structure implements a method for determining a gate-to-body current in a floating body FET. The determined gate-to-body current may be used to predict hysteresis in the floating body FET.

20 Claims, 4 Drawing Sheets

US 8,064,832 B2

METHOD AND TEST SYSTEM FOR DETERMINING GATE-TO-BODY CURRENT IN A FLOATING BODY FET

TECHNICAL FIELD

The present invention is generally in the field of semiconductor devices. More particularly, the invention is in the field of transistor design.

BACKGROUND ART

Floating body FETs, for instance silicon-on-insulator (SOI) MOFETS, exhibit different characteristics than bulk silicon devices. Among these differences are notable advantages, including reduced parasitic source/drain capacitance and enhanced performance at higher switching frequencies. Electrical isolation of the transistor body is not without its drawbacks, however. For example, floating body FETs can exhibit hysteresis, in which a particular FET's prior operational state can result in a shift in its threshold voltage. Because these threshold voltage variations are dynamically produced, they can result in performance instabilities, which may prove particularly problematic, or even harmful, to inverters for example. One of the most important operational parameters influencing hysteresis in a floating body FET is its gate-to-body current. As a result, accurate determination of the gate-to-body current is critical when designing circuits utilizing floating body FETs.

Because a floating body device lacks a body terminal to be accessed for direct measurement, a conventional approach to obtaining an estimate of the gate-to-body current in a floating body FET includes measuring an analogous gate-to-body current in a body-tied FET structure. Various layout configurations have been developed in attempts to improve the accuracy of the estimated gate-to-body current produced by this approach. Nevertheless, data obtained from conventional methods using body-tied devices consistently produce approximations of floating body gate-to-body currents that exaggerate their values, in some instances by substantial factors.

SUMMARY

A method and test system for determining gate-to-body current in a floating body FET, substantially as shown in and/or described in connection with at least one of the figures, as set forth more completely in the claims.

DETAILED DESCRIPTION OF THE INVENTION

The present invention is directed to a method and test system for determining gate-to-body current in a floating body FET. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the present invention, which use the principles of the present invention, are not specifically described in the present application and are not specifically illustrated by the present drawings.

Figure 1A:
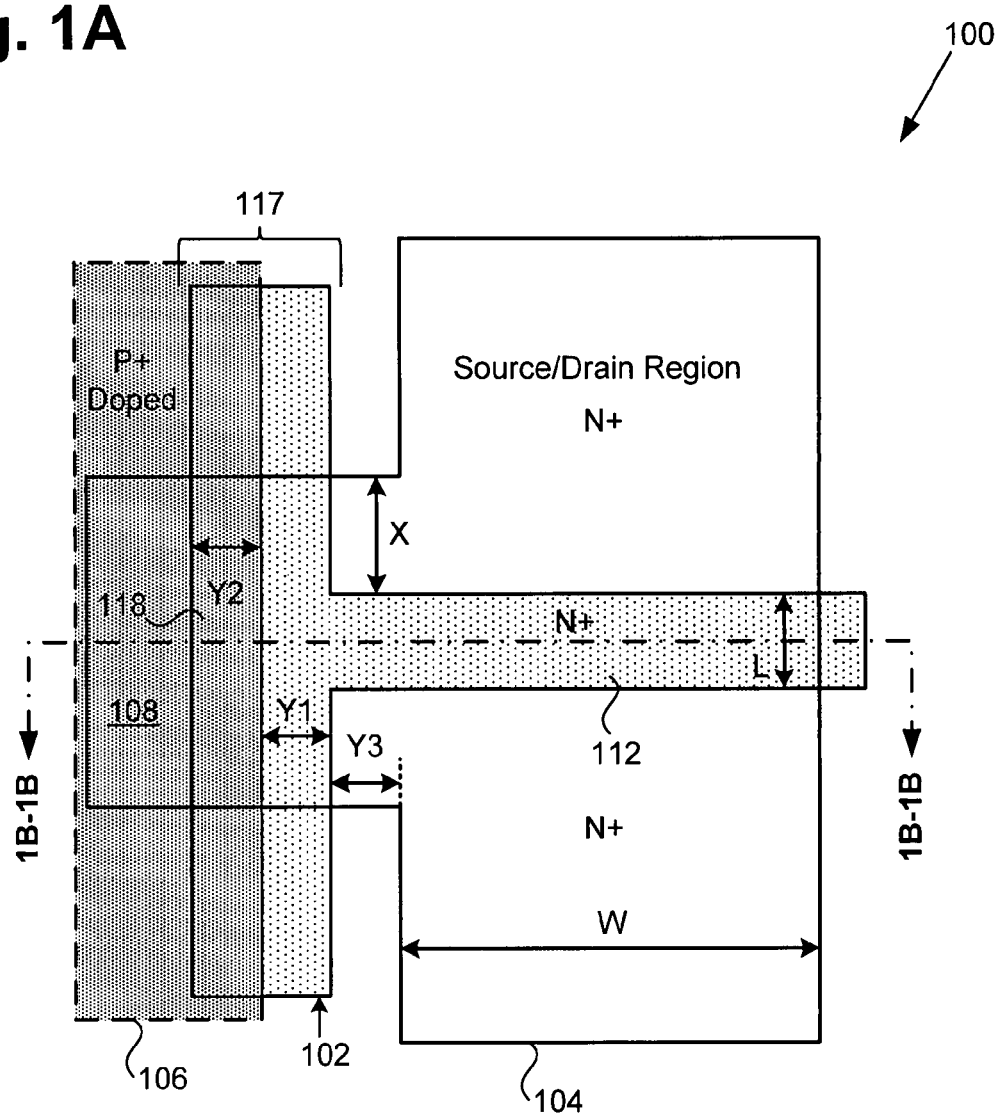
FIG. 1A shows a top view of an exemplary layout of a body-tied FET structure.

FIG. 1A shows a top view of an exemplary layout of a body-tied FET structure. Body-tied FET structure 100, in FIG. 1A, comprises gate 102 situated over active region 104, with a portion of both being included in doped implant application region 106. In the present exemplary layout, gate 102 is shaped like a "T", having crosspiece 117 with width equal to (Y1+Y2), and a stem having a length equal to L. Gate 102 includes doped implant gate region 118, which forms a portion of crosspiece 117, and gate region 112, which forms the remainder of gate 102. Gate 102 can comprise any suitable gate material, for example, polysilicon.

Active region 104 is situated below gate 102 in FIG. 1A. As shown there, active region 104 has a width in the source/drain regions equal to W, and a length equal to (2X+L) adjacent to the source/drain regions. Distance Y3 separates the source/drain regions formed in active region 104 from the portion of active region 104 situated under crosspiece 117 of gate 102. Active region 104 includes region 108, which is situated adjacent to doped implant gate region 118. Active region 104 may comprise a layer of semiconductor material, for example, silicon, appropriately doped, to form a source/drain region of width W, as shown in FIG. 1A.

Doped implant application region 106, also shown in FIG. 1A, includes doped implant gate region 118 of gate 102 and region 108 of active region 104, to provide a body contact for body-tied FET structure 100. Body-tied FET structure 100 is exemplary of layouts typically utilized to obtain estimates of gate-to-body current in a floating body FET. The hypothetical floating body FET for which body-tied FET structure 100 provides a gate-to-body current estimate, corresponds to a floating body FET having a gate defined by the dimensions L and W, in FIG. 1A. It should be noted that, although in the present example doped implant 106 is a P+ implant, and body-tied FET structure 100 corresponds to a body-tied NFET, in another example, the respective polarities may be reversed, so that the layout of FIG. 1A may be adapted for use with a body-tied PFET, for example.

A body-tied FET structure, such as body-tied FET structure 100 in FIG. 1A, is typically used to provide an estimate for a gate-to-body current in a floating body FET, because a floating body device lacks a body contact of its own and, as a result, direct measurement of the gate-to-body current cannot be performed. Measurement of the gate-to-body current in a floating body device may be of importance for a variety of reasons including, for example, the central role played by gate-to-body current in determining hysteresis in a floating body device. However, the gate-to-body currents measured from body-tied FET structures are known to consistently provide exaggerated estimates of the analogous currents in floating body FETs. Because of the close correspondence of gate-to-body current and hysteresis in a floating body device, the inaccuracy of estimates derived from conventional approaches to using body-tied FET structures negatively impacts circuit design and performance.

Figure 1B:
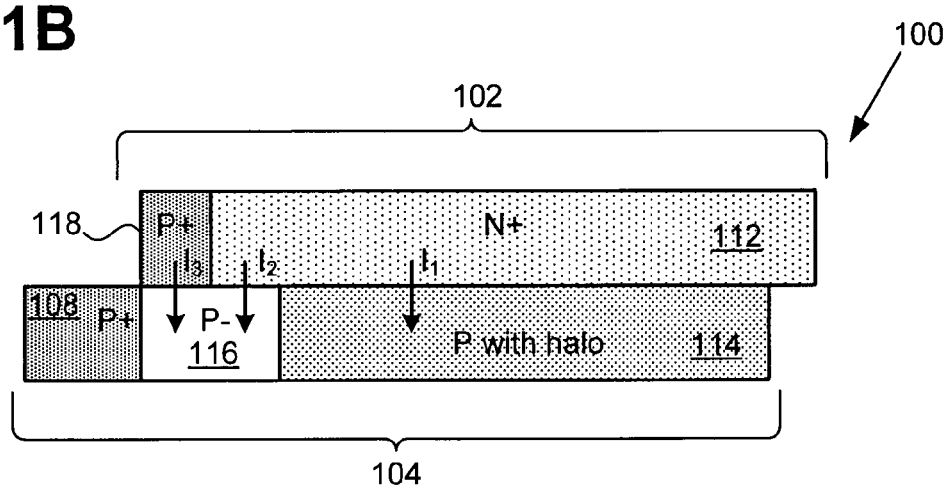
FIG. 1B shows a cross-sectional view of the body-tied FET structure of FIG. 1A along line 1B-1B.

Some reasons for the inaccuracy of estimates derived from direct measurement of the gate-to-body current of a body-tied FET structure can be seen from FIG. 1B. FIG. 1B shows a cross-sectional view of body-tied FET structure 100 of FIG. 1A along line 1B-1B. FIG. 1B shows gate 102 situated over active area 104. Gate 102, in FIG. 1B, comprises doped implant gate region 118 and gate region 112, also shown in FIG. 1A. Active region 104, in FIG. 1B, comprises region 108, shown in FIG. 1A, as well as intermediate region 116 and halo region 114, not shown in FIG. 1A. Intermediate region 116 can comprise, for instance, the semiconductor material from which active region 104 is formed. Halo region 114 underlies the narrow stem of gate 102 adjacent to crosspiece 117, but does not extend beyond the boundaries of that stem into the source/drain regions of active region 104. Halo region 114 may be prepared by halo doping of the semiconductor material underlying the stem of gate 102, in a manner familiar to one of ordinary skill in the art.

Also shown in FIG. 1B are current components flowing from gate 102 to active region 104. Present in FIG. 1B are gate-to-body current components $I_1$, $I_2$, and $I_3$. As shown in FIG. 1B, current component $I_1$ flows from gate region 112 to halo region 114, current component $I_2$ flows from gate region 112 to intermediate region 116, and current component $I_3$ flows from doped implant gate region 118 to intermediate region 116. Together, gate to body current components $I_1$, $I_2$, and $I_3$ constitute the total gate-to-body current measured from structure 100, according to Equation 1:

$$I_{gbT} = I_1 + I_2 + I_3 \quad \text{(Equation 1)};$$

where $I_{gbT}$ is the gate-to-body current for body-tied FET structure 100.

The inaccuracy of an estimate for gate-to-body current in a floating body FET based on a direct measurement of $I_{gbT}$, follows from the fact that a corresponding floating body FET will not include the body contact present in body-tied FET 100. Consequently, the gate-to-body current in a floating body FET will lack the current components corresponding to current flow through those extraneous regions, and an estimate of gate-to-body current that includes those spurious components will be proportionally exaggerated.

The present invention's method overcomes this deficiency in conventional approaches using direct measurement of $I_{gbT}$, by recognizing that $I_{gbT}$ comprises both desired and undesired current components. By expressing those current components in terms of current densities, and providing a relationship that permits extraction of the gate-to-body current density for a floating body FET, the present invention provides a means for determining the desired gate-to-body current in a floating body FET from the measured gate-to-body current in a plurality of body-tied FET structures and the physical dimensions of those structures.

Figure 2:
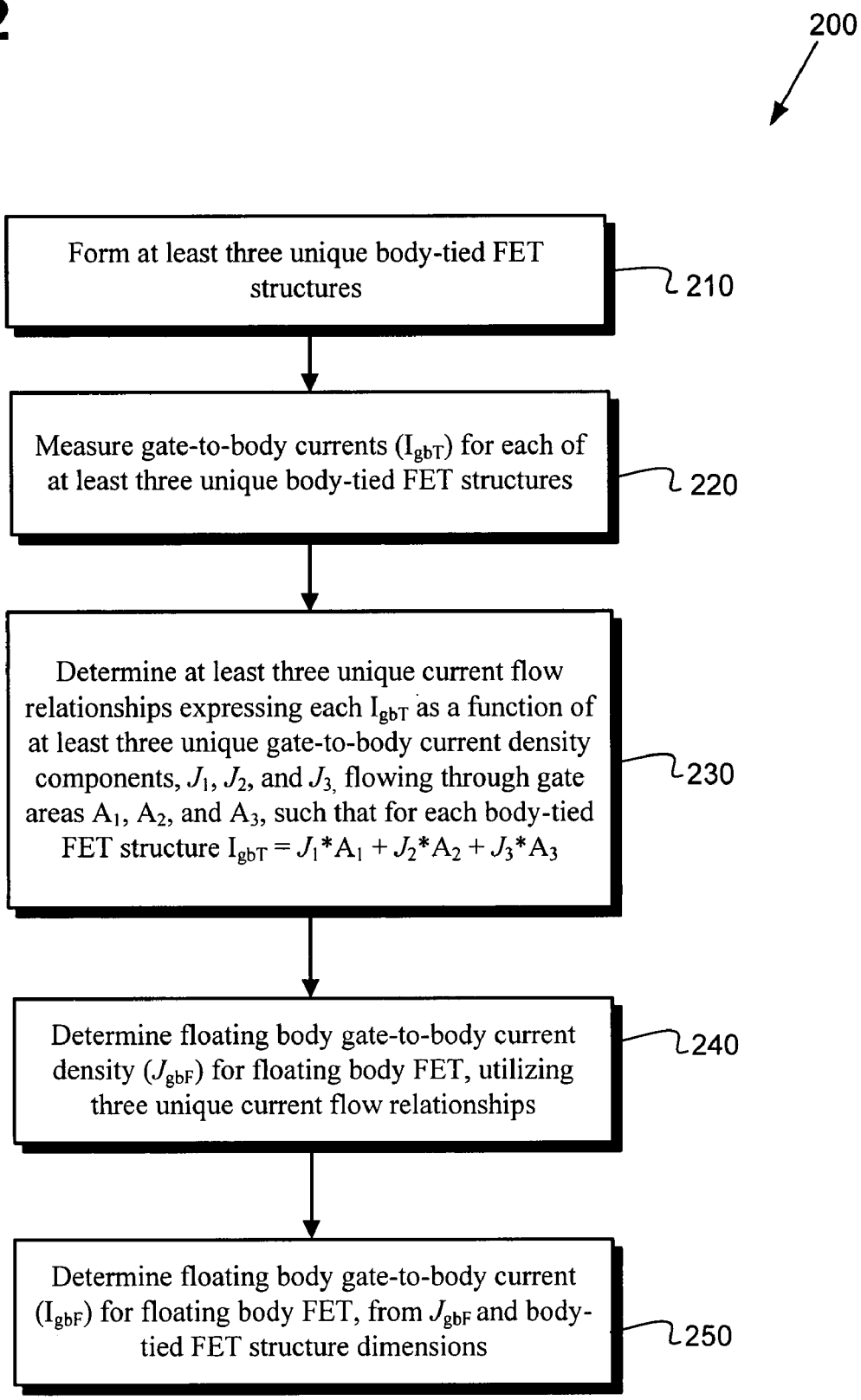
FIG. 2 shows a flow chart of an exemplary method to implement an embodiment of the present invention.

FIG. 2 shows a flow chart of an exemplary method to implement an embodiment of the present invention. Certain details and features have been left out of flowchart 200 that are apparent to a person of ordinary skill in the art. For example, a step may comprise one or more substeps or may involve specialized equipment or materials, as known in the art. While steps 210 through 250 indicated in flowchart 200 are sufficient to describe one embodiment of the present invention, other embodiments of the invention may utilize steps different from those shown in flowchart 200.

Referring now to step 210 in FIG. 2 and structure 100 in FIG. 1A, step 210 of flowchart 200 comprises formation of at least three unique body-tied FET structures. The purpose of step 210 may become more apparent from consideration of Equation 1. However, it should be noted that Equation 1 is invoked here for conceptual clarity only. As will be shown in a subsequent step, the present method utilizes current density components, rather than current components $I_1$, $I_2$, and $I_3$, per se, to determine the gate-to-body current in a floating body FET. Equation 1 shows that $I_{gbT}$ is a function of three unknown current components: $I_1$, $I_2$, and $I_3$. In order to determine those three unknowns, and obtain the gate-to-body current for a floating body FET from the desired current component, a system for solving Equation 1 is needed. As is well known, at least three independent equations are required to determine three independent unknown variables. Thus, the present method utilizes three unique body-tied FET structures to produce three independent current equations expressing three unique $I_{gbt}$ measurements in terms of current components $I_1$, $I_2$, and $I_3$. Simultaneous solution of the system containing those three independent equations will provide the information necessary to determine the gate-to-body current for a corresponding floating body FET.

Step 210 of flowchart 200, includes the constraint that the body-tied FET structures be unique. That constraint is satisfied provided that the at least three body-tied FET structures are physically independent of one another. In one embodiment, the three unique body-tied FET structures are separate pad devices. The three body-tied FET structures may have similar geometries, and may or may not share dimensions in common. For example, two physically separate body-tied FET structures may still be unique despite sharing dimensions such as W, L, Y1, Y2, or Y3, in FIG. 1A, for example.

Continuing with step 220 in FIG. 2, $I_{gbT}$ is measured for each of the at least three unique body-tied FET structures formed in step 210. Measurement of the at least three distinct $I_{gbT}$ values may be performed according to any suitable technique, as known in the art.

At step 230 of flowchart 200, current flow relationships are determined, which express the $I_{gbT}$ values measured for each unique body-tied FET structure in step 220, in terms of current density components $J_1$, $J_2$, and $J_3$. Current density components $J_1$, $J_2$, and $J_3$ are analogues of current components $I_1$, $I_2$, and $I_3$, in equation 1, and allow the relationship determined in the present step to take account of differences in the physical dimensions of the at least three unique body-tied FET structures formed in step 210. Expressing the relationship established by Equation 1 in terms of current density components gives Equation 2:

$$I_{gbT} = J_1 * A_1 + J_2 * A_2 + J_3 * A_3 \quad \text{(Equation 2)};$$

where $J_1$, $J_2$, and $J_3$ are the current densities of, respectively, $I_1$, $I_2$, and $I_3$, shown in FIG. 1B, and $A_1$, $A_2$, and $A_3$ are the respective gate areas through which $J_1$, $J_2$, and $J_3$ flow, to produce $I_1$, $I_2$, and $I_3$, in that figure.

Turning to FIGS. 1A and 1B, we may obtain an exemplary expression for Equation 2, based on the dimensions of the exemplary body-tied FET structural layout presented there. Substituting the appropriate dimensions from structure 100 of FIG. 1A into Equation 2 gives the following expression:

$$I_{gbT} = J_1 * [(W*L)+(Y3*L)] + J_2 * [(2X+L)*Y1] + J_3 * [(2X+L)*Y2];$$

where $A_1 = [(W*L)+(Y3*L)]$, $A_2 = [(2X+L)*Y1]$, and $A_3 = [(2X+L)*Y2]$. In a similar fashion, Equation 2 may be used in conjunction with the specific dimensions of at least two additional body-tied FET structures formed in step 210, to express at least three independent relationships amongst the measured $I_{gbT}$ values and current density components $J_1$, $J_2$, and $J_3$.

Continuing with step 240 in FIG. 2, step 240 of flowchart 200 comprises determining the gate-to-body current density for a floating body FET ($J_{gbF}$), utilizing the current flow relationships found in the previous step. Those relationships form a group of at least three independent equations containing three unknown variables, i.e. $J_1$, $J_2$, and $J_3$, presenting a linear system that may readily be solved to give values for $J_1$, $J_2$, and $J_3$. The desired current density component or components can then be utilized to form an expression for $J_{gbF}$, for example, $J_{gbF}=J_1$ for the exemplary layout presented in FIG. 1A. That $J_{gbF}=J_1$ for structure 100 in FIG. 1A may be seen from that figure and FIG. 1B as follows. As explained previously, body-tied FET structure 100 in FIG. 1A corresponds to a floating body FET having a gate defined by the dimensions L and W, in FIG. 1A. FIG. 1B shows that the only component of $I_{gbT}$ flowing between those portions of gate 102 and active region 104 is current component $I_1$. Thus, the current density component giving rise to current $I_1$ is also $J_{gbF}$, hence $J_1=J_{gbF}$ for structure 100 in FIG. 1A.

Finally, in step 250 of flowchart 200 the gate-to-body current for the floating body FET corresponding to body-tied FET structure 100 can be determined from $J_{bf}$ and the dimensions presented by structure 100, in FIG. 1A. From the foregoing, it may be seen that the floating body gate-to-body current ($I_{gbF}$) is determined by $J_{gbF}$ and the floating body FET gate area (W*L) there. Thus, in FIG. 1A, $I_{gbF}=J_1*(W*L)$. As described, steps 210 through 250 of flowchart 200 determines $J_{gbF}$ and $I_{gbF}$ from measurement of $I_{gbT}$ from at least three unique body-tied FET structures, where the measured $I_{gbT}$ values are produced by application of a particular gate voltage ($V_g$) to each unique body-tied FET structure. Steps 210 through 250 may be repeated using the same unique body-tied FET structures, for any desired range of gate voltages, thereby providing a relationship between applied gate voltage and gate-to-body current that can be used to form a predictive model of hysteresis for a floating body FET of interest.

Figure 3:
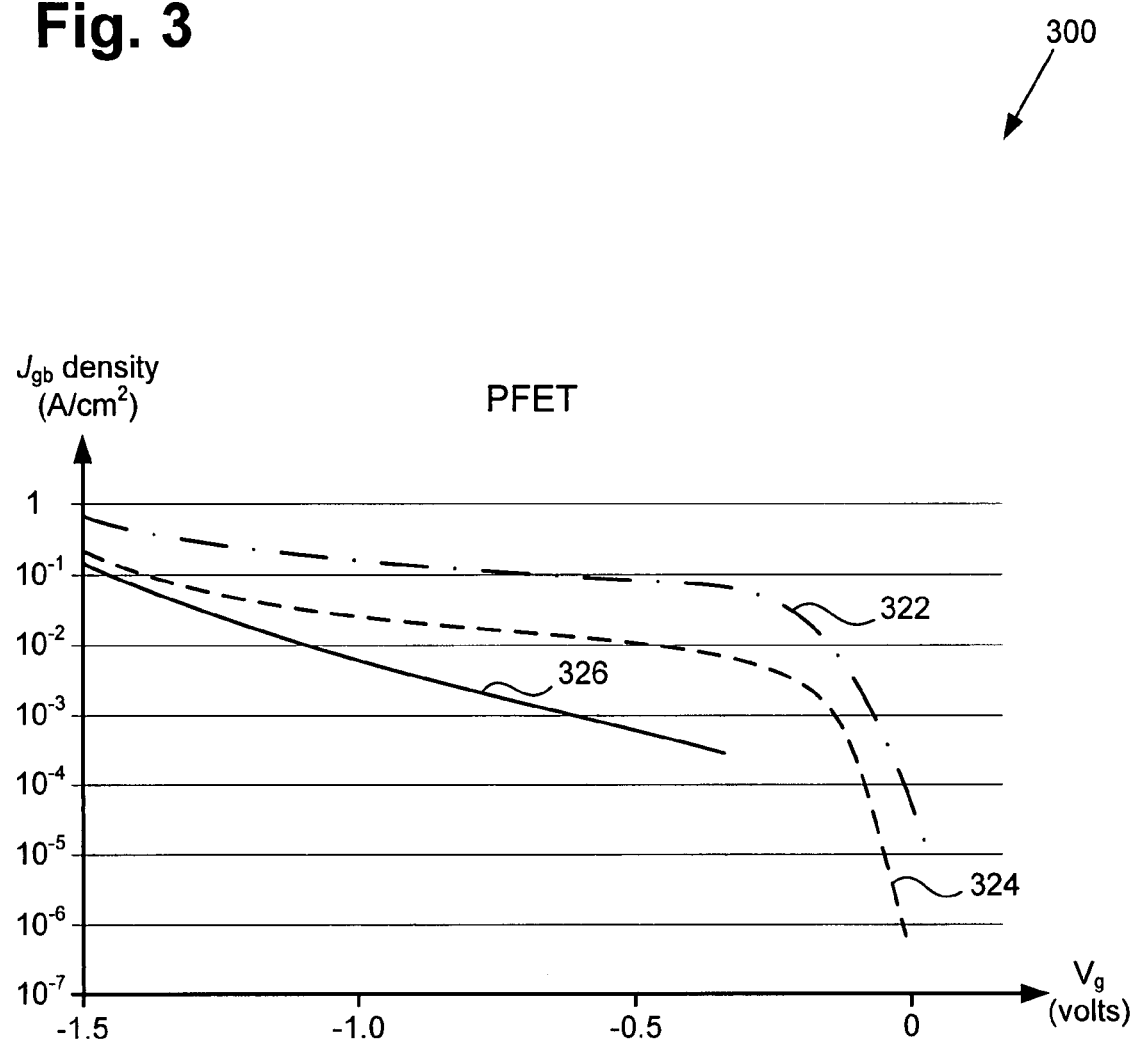
FIG. 3 shows a graph comparing a floating body gate-to-body current density obtained from one embodiment of the present invention's method, with gate-to-body current densities measured directly from two body-tied FET structures.

Turning now to FIG. 3, FIG. 3 shows a graph comparing a floating body gate-to-body current density obtained from one embodiment of the present invention's method, with gate-to-body current densities measured directly from two body-tied FET structures. Graph 300 in FIG. 3 shows gate-to-body current density ($J_{gb}$) in amperes per square centimeter, as a function of gate voltage ($V_g$) in volts. The data presented in graph 300 were obtained using PFET devices. However, the present invention may be used to determine a gate-to-body current for any type of floating body FET including, but not limited to, NFETs, PFETs, MOSFETs, and silicon-on-insulator (SOI) based devices, for example.

In graph 300, the measured values of $J_{gb}$ for two independent body-tied PFET structures is shown by curves 322 and 324, while the value of $J_{gb}$ for a corresponding floating body device and determined by the present invention's method is shown by curve 326. Comparison of the current density values over the range of gate voltages shown demonstrates the significant exaggeration of gate-to-body current values provided by body-tied FET structures utilized in conventional methods. Both curves 332 and 334 show significant deviation from floating body values across most gate voltages. Moreover, both curves 332 and 334 consistently exaggerated the gate-to-body current, so that even if numerous body-tied structures were utilized individually, and their resulting estimates averaged, those resulting estimates would be both inaccurate and overstated as well. Attention to the vertical scaling of graph 300 reveals that for some values of $V_g$, the gate-to-body current values provided by curve 324 may deviate by as much as an order of magnitude from those determined from the present method, while the values provided by curve 322 show deviations of as much as two orders of magnitude from the present method's results.

Figure 4:
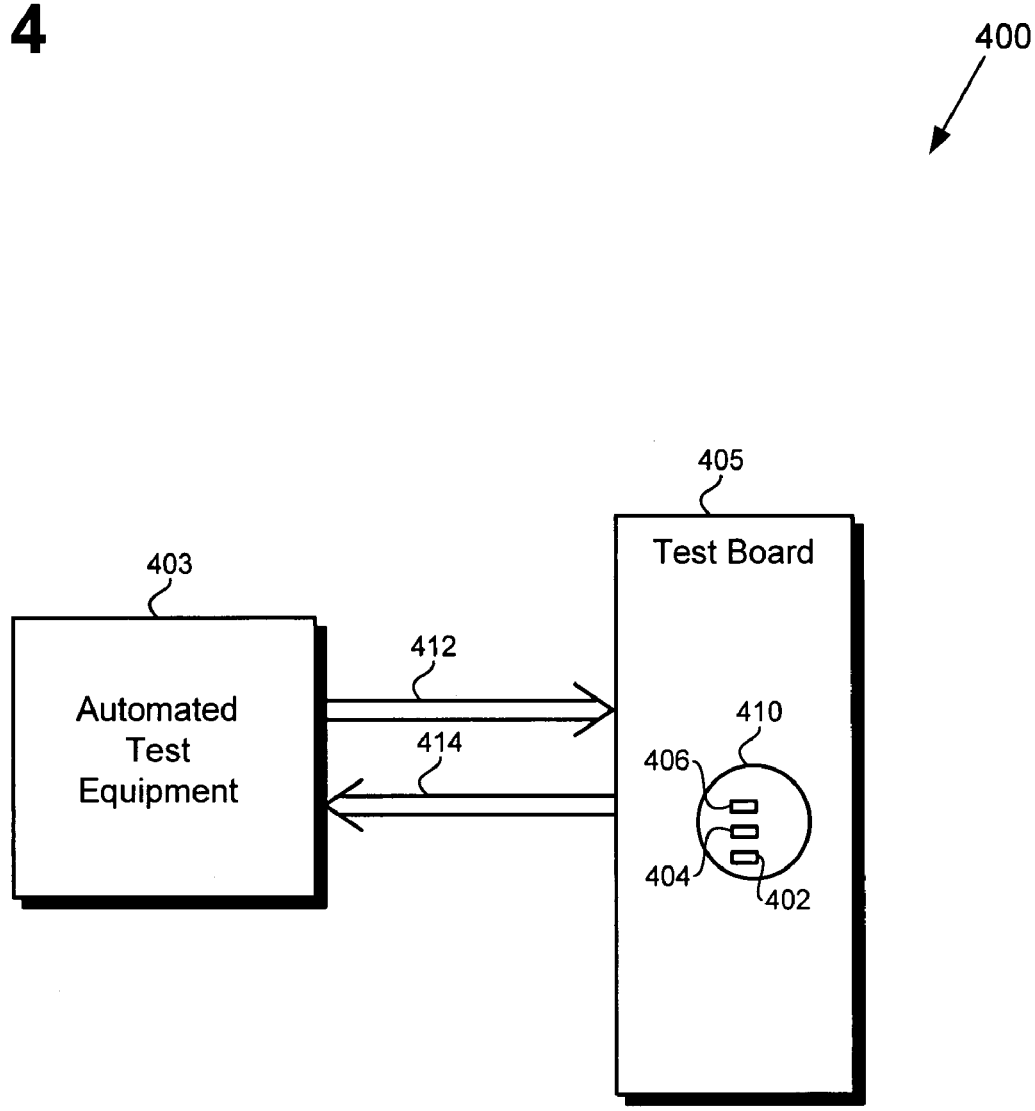
FIG. 4 shows an exemplary test system including an exemplary wafer under test and multiple exemplary body-tied FET structures in accordance with one embodiment of the present invention.

FIG. 4 shows a diagram of an exemplary test system, where the test system is utilized to implement one or more embodiments of the invention's method, described above. Such a system might be utilized during circuit design in order to predict hysteresis in a floating body FET, for example. FIG. 4 shows an exemplary test system including an exemplary wafer under test and multiple exemplary test structures configured to provide at least three unique gate-to-body currents corresponding to at least three unique body-tied FET structures, in accordance with one embodiment of the present invention. Test system 400 includes automated (i.e. computerized) test equipment 403 and test board 405. Test board 405 includes wafer under test 410, which includes unique body-tied FET structures 402, 404, and 406. Wafer under test 410 can also include additional structures (not shown in FIG. 4), which are similar to unique body-tied FET structures 402, 404, and 406.

As shown in FIG. 4, test board 405 is coupled to automated test equipment 403 by buses 412 and 414. Test board 405 can include a number of interconnect traces (not shown in FIG. 4) to couple signals to and from automated test equipment 403 to the appropriate contact points or pads on each test structure on wafer under test 410. In the present embodiment, wafer under test 410 is mounted on test board 405. In an alternative embodiment, wafer under test 410 may not be mounted on test board 405, and may be connected directly to automated test equipment 403 via a number of probes and buses 412 and 414.

Automated test equipment 403 is configured to apply a suitable voltage to, for example, gate 102 of body-tied FET structure 100, in FIG. 1, and to measure currents such as, for example, current components $I_1$, $I_2$, and $I_3$, of body-tied FET structure 100. Automated test equipment 403 is also configured to measure the at least three unique body-tied gate-to-body $I_{gbT}$ currents provided by independent body-tied FET structures 402, 404, and 406, for example. Automated test equipment 403 is further configured to determine floating body gate-to-body current utilizing three unique current flow relationships according to an embodiment of the invention's method as described in flowchart 200 in FIG. 2, and to more accurately predict hysteresis, in a floating body FET.

Thus, the present invention's method and test system make it possible to determine the gate-to-body current of a floating body FET, by extracting the desired current component from the gate-to-body current measured directly from at least three unique body-tied FET structures. By extracting a desired current component from the directly measured current provided by a body-tied FET structure, rather than utilizing the directly measured value as an estimate of its floating body analogue, the present invention avoids the inaccuracies and exaggerations plaguing conventional approaches. Moreover, because the gate-to-body current plays an important role in controlling hysteresis in a floating body FET, its accurate determination, made possible by the present invention's method and test system, advantageously enables more accurate prediction of hysteresis in those devices. That, in turn, renders circuit design more efficient, and the electronic systems utilizing those floating body devices more reliable. Thus, it is manifest that the gate-to-body current of FETs determined according to various embodiments of the invention can be used in an improved field effect transistor model. Such improved model can in turn be utilized to fabricate improved production field effect transistors, and to fabricate production chips based on the improved production field effect transistors.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a method and test system for determining gate-to-body current in a floating body FET has been described.

The invention claimed is:

1. A method for determining a gate-to-body current for a floating body FET, said method comprising the steps of:
measuring at least three unique gate-to-body currents corresponding to at least three unique body-tied FET structures that are physically independent of one another;
determining at least three unique relationships between said at least three unique gate-to-body currents and at least three gate-to-body current density components for said at least three unique body-tied FET structures;
utilizing said at least three unique relationships to determine said gate-to-body current for said floating body FET.

2. The method of claim 1 wherein said determining step comprises expressing each of said at least three unique gate-to-body currents as a sum of a first gate-to-body current density component multiplied by a first gate area, a second gate-to-body current density component multiplied by a second gate area, and a third gate-to-body current density component multiplied by a third gate area.

3. The method of claim 1 wherein said utilizing step comprises solving at least three independent equations expressing said at least three unique relationships resulting from said determining step.

4. The method of claim 1 further comprising a step of determining a gate area of said body-tied FET structure corresponding to a floating body FET gate area.

5. The method of claim 4 further comprising a step of identifying a floating body current density flowing through said floating body FET gate area.

6. The method of claim 5 further comprising a step of determining said gate-to-body current for said floating body FET by forming a product of said floating body current density and said floating body FET gate area.

7. The method of claim 1 further comprising a step of utilizing said gate-to-body current of said floating body FET to predict hysteresis in said floating body FET.

8. The method of claim 1 wherein said floating body FET is a silicon-on-insulator (SOI) MOSFET.

9. The method of claim 1 further comprising a step of utilizing said gate-to-body current in a field effect transistor model.

10. The method of claim 9 further comprising a step of using said field effect transistor model to fabricate production field effect transistors.

11. The method of claim 10 further comprising a step of using said production field effect transistors in one or more production chips.

12. A method for determining a gate-to-body current for a floating body FET, said method comprising the steps of:
measuring a respective gate-to-body'current ($I_{gbT}$) for at least three unique body-tied FET structures that are physically independent of one another;
determining at least three current flow relationships by expressing said respective gate-to-body current as a sum of a first gate-to-body current density component multiplied by a first gate area, a second gate-to-body current density component multiplied by a second gate area, and a third gate-to-body current density component multiplied by a third gate area;
determining a floating body gate-to-body current density ($j_{gbF}$) by utilizing said at least three current flow relationships, and utilizing said floating body gate-to-body current density to determine said a gate-to-body current for said floating body FET.

13. The method of claim 12 further comprising a step of determining a gate area of said body-tied FET structure corresponding to a floating body FET gate area.

14. The method of claim 13 further comprising a step of determining said gate-to-body current for said floating body FET by forming a product of said floating body gate-to-body current density and said floating body FET gate area.

15. The method of claim 12 further comprising a step of utilizing said gate-to-body current of said floating body FET to predict hysteresis in said floating body FET.

16. The method of claim 12 wherein said floating body FET is a silicon-on-insulator (SOI) MOSFET.

17. A test system comprising automated test equipment coupled to a wafer under test, said wafer under test comprising at least three unique body-tied FET structures that are physically independent of one another, said automated test equipment determining a gate-to-body current for a floating body FET by using a method comprising steps of:
measuring at least three unique gate-to-body currents corresponding to said at least three unique body-tied FET structures;
determining at least three unique relationships between said at least three unique gate-to-body currents and at least three gate-to-body current density components for said at least three unique body-tied FET structures;
utilizing said at least three unique relationships to determine said gate-to-body current for said floating body FET.

18. The test system of claim 17 wherein said determining step comprises expressing each of said at least three unique gate-to-body currents as a sum of a first gate-to-body current density component multiplied by a first gate area, a second gate-to-body current density component multiplied by a second gate area, and a third gate-to-body current density component multiplied by a third gate area.

19. The test system of claim 17 wherein said utilizing step comprises solving at least three independent equations expressing said at least three unique relationships resulting from said determining step.

20. The test system of claim 17 further comprising a step of determining a gate area of said body-tied FET structure corresponding to a floating body FET gate area.

* * * * *